United States Patent
Eklof

(12) 
(10) Patent No.: US 6,434,707 B1
(45) Date of Patent: Aug. 13, 2002

(54) LOW PHASE JITTER CLOCK SIGNAL GENERATION CIRCUIT

(75) Inventor: Anders Eklof, Poolesville, MD (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/327,289

(22) Filed: Jun. 7, 1999

(51) Int. Cl.[7] ............................... G06F 1/08; G06F 1/04
(52) U.S. Cl. ...................... 713/500; 710/58; 713/501; 713/503; 327/115
(58) Field of Search ................ 713/500, 501, 713/503; 710/58; 327/115

(56) References Cited

U.S. PATENT DOCUMENTS

| | | | |
|---|---|---|---|
| 5,202,642 A | * 4/1993 | Dixon | 328/14 |
| 5,444,420 A | 8/1995 | Wernlund | 331/1 R |
| 5,448,191 A | 9/1995 | Meyer | 327/105 |
| 5,459,418 A | 10/1995 | Uriya | 327/105 |
| 5,495,202 A | * 2/1996 | Hsu | 327/113 |
| 5,495,206 A | 2/1996 | Hietala | 331/1 A |
| 5,500,613 A | 3/1996 | Gazsi | 327/107 |
| 5,517,155 A | 5/1996 | Yamauchi | 331/1 A |
| 5,521,534 A | 5/1996 | Elliott | 327/129 |
| 5,528,181 A | * 6/1996 | Suggs | 327/115 |
| 5,539,346 A | 7/1996 | Goto | 327/156 |
| 5,546,052 A | 8/1996 | Austin | 331/1 A |
| 5,570,398 A | 10/1996 | Smith | 375/376 |
| 5,598,448 A | 1/1997 | Girardeau | 375/376 |
| 5,619,154 A | 4/1997 | Strolle | 327/129 |
| 5,638,010 A | 6/1997 | Adams | 327/105 |
| 5,793,193 A | * 8/1998 | Hodgins | 323/284 |
| 6,163,181 A | * 12/2000 | Nishiyama | 327/115 |
| 6,232,878 B1 | * 5/2001 | Rubin | 340/572.1 |

FOREIGN PATENT DOCUMENTS

EP    WO 99/03201    1/1999

OTHER PUBLICATIONS

Dr. Neil Downie, Maran & Company Ltd. 1999 Technology Bulletin, "The Anti-Jitter Circuit" pp. 1–7.

* cited by examiner

*Primary Examiner*—Jeffrey Gaffin
*Assistant Examiner*—Rehana Perveen

(57) ABSTRACT

A direct digital synthesis (DDS) clock generation circuit (100) produces a digital clock signal having low phase jitter. A N/M digital divider circuit (103) produces an output signal having a frequency of N/M times an input clock frequency. The N/M digital divider (103) generates a control signal that is used to alternately charge and discharge a capacitor (122) through a current source (118) and a current sink (116) to produce a linear sawtooth waveform having rising and falling rates which are proportional to the N and M−N values, respectively. A voltage sensor and current controller (120) automatically adjust the current sink (116) and current source (188) to maintain waveform amplitude at a relatively constant magnitude and average DC level. A voltage comparator (126) compares the instantaneous voltage on the capacitor (122) to a bias voltage and produces the digital clock signal having low phase jitter without the use of a sine look-up table, a digital-to-analog converter, or an analog filter.

14 Claims, 2 Drawing Sheets

US 6,434,707 B1

LOW PHASE JITTER CLOCK SIGNAL GENERATION CIRCUIT

FIELD OF THE INVENTION

This invention relates generally to direct digital synthesis (DDS) clock signal generation, and more specifically, to a low phase jitter DDS clock signal generator.

BACKGROUND OF THE INVENTION

There is a demand in the electronics industry for DDS digital clock signal generators that have low phase jitter, high frequency resolution, and accuracy. The existing DDS technology that can produce digital clock signals having low phase jitter and high frequency resolution come at the expense of high power requirements and the use of expensive components.

To generate the desired clock signal, a clock generation circuit typically requires the use of a power consuming sine look-up table, an expensive digital to analog converter and an expensive low pass filter. A digital clock signal generation circuit typically uses a digital numerically controlled oscillator (NCO) to generate the desired clock signal with the multi-bit digital output of the NCO being fed to a sine look-up table. The output of the look-up table is then converted using a digital-to-analog converter (D/A). The analog signal is then passed through a low pass filter to remove frequencies associated with the input clock and aliasing effects. To generate a digital clock signal, the filtered sine wave is sliced to generate the desired clock signal.

U.S. Pat. No. 5,521,534 to Elliott discloses an example of a digital clock generator that uses a power consuming sine look-up table to produce digital clock signals. In Elliott, an NCO is used with a difference engine, a phase adder and a phase accumulator to create an output signal that is fraction of a clock reference signal. This output signal is then fed to a sine look-up table to generate a digital sine wave output signal having low phase jitter.

Other circuits, such as disclosed by U.S. Pat. No. 5,459,418 to Uriya et al., are able to generate a digital clock signal without using a power consuming sine look-up table. However, Uriya still requires the use of an expensive digital-to-analog converter. To generate the desired sine wave, Uriya uses a three sawtooth wave signal generation circuit. However, the generated sine wave requires shaping which Uriya accomplishes by using a counter and a digital-to-analog converter to affect rising and falling of the sine wave. The digital-to-analog converter is used to convert the contents of the counter to an analog value which is then applied to the three sawtooth wave signal generation circuit to shape the sine wave.

Therefore, there is a need to produce a digital clock signal having low phase jitter without requiring expensive and power consuming sine look-up tables, filters, or digital-to-analog converters.

DETAILED DESCRIPTION

Generally, the present invention provides a digital clock generation circuit which produces a digital clock signal having low phase jitter. A N/M digital divider circuit produces an output signal having a frequency of N/M times the input clock frequency. The N/M digital divider generates an output signal used to control the charging and discharging of a capacitor to produce a linear sawtooth waveform which has rising and falling rates that are proportional to the N and M values.

The N/M digital divider circuit includes a multi-bit register that is used to maintain a sum value. The sum value is compared to a modulus value. Based on this comparison, the comparator determines selections of the next entry to be entered into the multi-bit register.

The output of the comparator is also used to choose between two current sources that are connected to the capacitor. The current sources control the voltage on the capacitor by charging and discharging the capacitor. A voltage comparator compares the instantaneous voltage on the capacitor with a reference voltage. If the instantaneous voltage on the capacitor is above the reference voltage, then the voltage comparator produces a digital low value, otherwise the voltage comparator produces a digital high value. The voltage comparison results in an output digital clock signal with a constant time interval between consecutive falling edges. The consecutive falling edges constitute a clock signal having low phase jitter, and is generated without the use of a power consuming sine look-up table, without an expensive analog-to-digital converter, and without an expensive low pass filter. Note that one skilled in the art will recognize that an output digital clock signal may be produced having a constant time interval between consecutive rising edges instead of consecutive falling edges.

Figure 1:
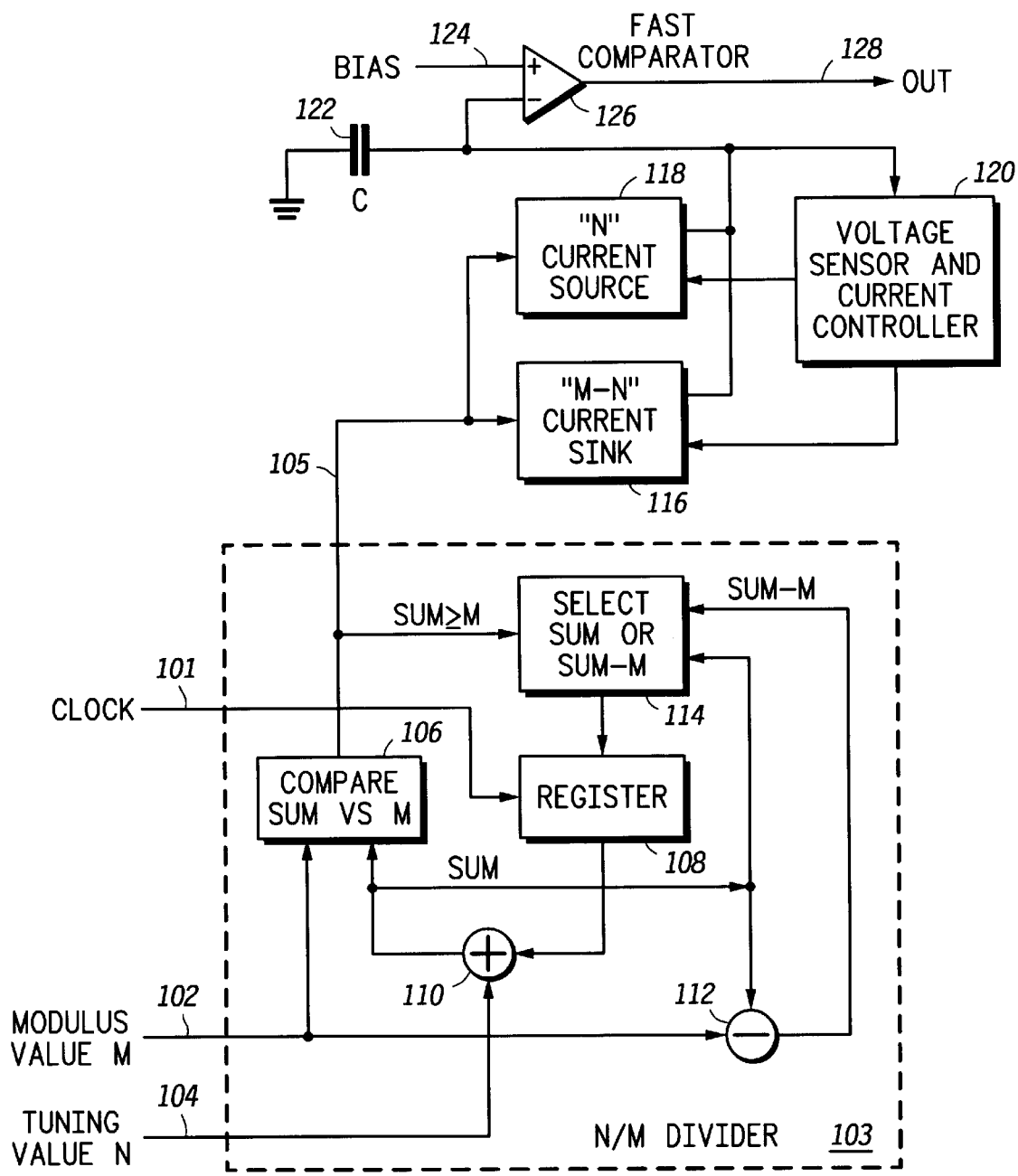
FIG. 1 illustrates a block diagram of a low jitter clock generator in accordance with one embodiment of the present invention.

FIG. 1 illustrates a block diagram of a low jitter clock generator 100 in accordance with one embodiment of the present invention. Clock generator 100 includes N/M divider 103, "M–N" current sink 116, "N" current source 118, voltage sensor and current controller 120, capacitor 122, and comparator 126. N/M divider circuit 103 includes comparator 106, register 108, summation circuit 110, subtraction circuit 112, and select circuit 114. In the illustrated embodiment, N/M divider 103 a true N/M divider circuit where M is the numerical value of the divider modulus and N is the tuning value for the divider output frequency. Although N/M digital divider circuit 103 is used in the illustrated embodiment, other implementations of digital divider circuits can be used to provide a signal to current sink 116 and current source 118. In the illustrated embodiment, signal 105 from comparator 106 is a one clock cycle long pulse that is generated as a result of the most significant bit (MSB) of N/M digital divider circuit 103 returning to a zero value, and indicates that the MSB has returned to a zero value. Note that even though signal 105 is present for one clock cycle, the zero value may be present for many clock cycles. With a traditional NCO, M is typically a fixed power of two (2), but in the circuit of FIG. 1, both M and N are integer values that can be provided as inputs to the circuit by the user. In the illustrated embodiment, both N and M can be independently set, and M should be at least twice as large as N. For the example shown in FIG. 2, N is equal to six (6) and M is equal to nineteen (19).

N/M divider circuit 103 receives input clock signal 101 labeled "CLOCK", which is applied to an input of multi-bit register 108. Summation circuit 110 performs a numerical addition of an input signal labeled "TUNING VALUE N" 104 and the contents of multi-bit register 108 which produces a summation value labeled "SUM". The SUM value is routed to comparator 106 which compares the SUM value to a value labeled "MODULUS VALUE M" 102. Comparator 106 produces the signal 105 which is fed to select circuit 114, current source 118 and current sink 116. Signal 105 from comparator 106 is a signal that indicates whether the numerical value of TUNING VALUE N plus the present contents of multi-bit register 108 is at least equal to MODULUS VALUE M. The output signal of comparator 106 controls select circuit 114, which selects the next entry into multi-bit register 108. As long as the SUM value is smaller than the desired modulus value M, comparator 106 sends a select signal to select circuit 114 which selects the SUM value as the next entry into multi-bit register 108. At the next clock cycle, the SUM value is entered into multi-bit register 108. At this point, N/M divider circuit 103 is functioning like a traditional binary accumulator.

However, when the SUM value exceeds or equals the MODULUS VALUE M, comparator 106 produces signal 105, labeled "SUM≧M", that causes select circuit 114 to select a subtraction value (SUM−M) as the next input value to register 108. The subtraction value (SUM−M) is created by subtraction circuit 112. Subtraction circuit 112 subtracts MODULUS VALUE M 102 from the SUM value. In this case, because the SUM value from summation circuit 110 is greater than or equal to MODULUS VALUE M 102, the result (SUM−M) of the subtraction is a positive number.

Having the ability to set MODULUS VALUE M provides several benefits. One benefit is when the tuning accuracy needs to be very high, or nearly perfect with respect to the input clock. For example, setting MODULUS VALUE M equal to the input clock frequency value in Hz allows the output frequency to be selected in 1 Hz increments regardless of the actual reference frequency. In contrast, a typical NCO integrated circuit having an M value that is a power of two, is unable to generate 1 Hz increments from a reference that is not a power of two number of Hz.

Another benefit of being able to select the MODULUS VALUE M is that all frequency settings can then be precise integer values rather than the nearest approximation based on a fixed M. As a result, the M value can then be designed to meet settability resolution rather than precision requirements. The latter are often far more stringent. For instance, if the tuning resolution increments need to be 100 Hz, but the accuracy must be better than 0.02 Hz at each frequency, a 50 MHz input clock frequency allows register 108 to have 19 bits with M=500,000. The output frequency accuracy with respect to clock 101 is then perfect. If M were a fixed power of two, register 108 would have to have 32 bits to achieve an output frequency accuracy of 0.011 Hz.

Referring again to FIG. 1, comparator 106 compares the SUM value and MODULUS VALUE M 102. If the SUM value is equal to or greater than MODULUS VALUE M 102, then the output of comparator 106 is a digital high value. The logic level stays at the digital high value for one clock cycle. If the SUM value is less than the MODULUS VALUE M 102, then the output of comparator 106 is a digital low value.

The output of comparator 106 also controls two current generators, a current source (sink) 116 and a current source 118. Current sink 116 is used to discharge capacitor 122 and current source 118 is used to charge capacitor 122. Capacitor 122 has a first plate electrode coupled to ground, and a second plate electrode coupled to current sink 116 and current source 118, to an input of comparator 126, and to voltage sensor and current controller 120. Current sink 116 and current source 118 operate in a mutually exclusive manner. When current sink 116 is turned on, current source 118 is turned off, and vice versa. In operation, current sink 116 and current source 118 cause capacitor 120 to charge and discharge, producing a sawtooth shaped signal at an input of voltage sensor and current controller 120 and comparator 126.

Voltage sensor and current controller 120 detects the minimum and maximum values of the sawtooth signal and as a result, adjusts current sink 116 and current source 118 accordingly. Voltage sensor and current controller 120 adjusts current sink 116 so that the sawtooth signal reaches an optimum minimum level for driving comparator 126, and adjusts current source 118 so that the sawtooth signal reaches the optimum maximum level for driving comparator 126. As a result, the output of voltage comparator 126 is a cleaner signal.

By implementing voltage sensor and current controller 120 into the circuit, the present invention is able to produce the proper ratio between the charging and discharging currents, where the proper ratio for the illustrated embodiment is N/(M−N). Due to the action of N/M divider 103, current sink 116 turns on for the duration of one cycle of input clock 101 when the SUM value equals or exceeds the MODULUS VALUE M 102. On average, this happens every N/M clock cycles, therefore the long-term average duty cycle of current sink 116 is equal to N/M. Current source 118 is on when current sink 116 is off, which is to say that the current source 118 average duty cycle is equal to 1−N/M. The ratio of the two duty cycles is (N/M)/(1−N/M)=N/(M−N). Voltage sensor and control 120 keeps the average DC voltage on capacitor 122 constant, thus the magnitude of the currents from current sink 116 and current source 118 are exactly inversely proportional to their duty cycles, thereby producing a zero sum average charge and discharge current. As a result, capacitor 122 charges linearly at a rate of N voltage units for each cycle of input clock signal CLOCK 101, and discharges linearly at a rate of M−N voltage units per clock cycle, with the discharge taking place at an average every N/M clock cycles.

Capacitor 122 produces a linear ramp waveform which is positively charged most of the time and discharges partially in a cyclic manner. Voltage sensor and current controller 120 sets the currents of current source 118 and current sink 116 so that the discharge rate is greater than the charge rate by the factor (M−N)/N. This causes the long term average charge on capacitor 122 to be constant even though the waveform is a repetitive linear waveform in the short run. The charge rate has a value of N and the discharge rate has a value of N−M. If the time duration of the charging current is M/N−1 clock cycles, the average charge time on capacitor 122 remains constant even though the waveform has a repetitive linear sawtooth waveform in the short term.

In the illustrated embodiment, voltage comparator 126 is characterized as being a fast voltage comparator that is capable of producing logic level outputs with fast rise and fall times at frequencies up into the 100 MHz range. Voltage comparator 126 compares the instantaneous voltage on capacitor 122 to a reference or bias voltage labeled "BIAS" 124. When the voltage on capacitor 122 equals or exceeds bias voltage 124 by a small amount, the output of voltage comparator 126 goes to a digital low value. When the voltage on capacitor 122 is less than the bias voltage 122, then the output of voltage comparator 126 goes to a digital high value. In the illustrated embodiment, the value of bias voltage 124 is approximately the midpoint between the positive and negative rails. The output of voltage comparator 126 generates a digital clock output signal 128, labeled "OUT", which exhibits the property that the time interval between consecutive negative edges is constant, thus having no phase jitter.

Figure 2:
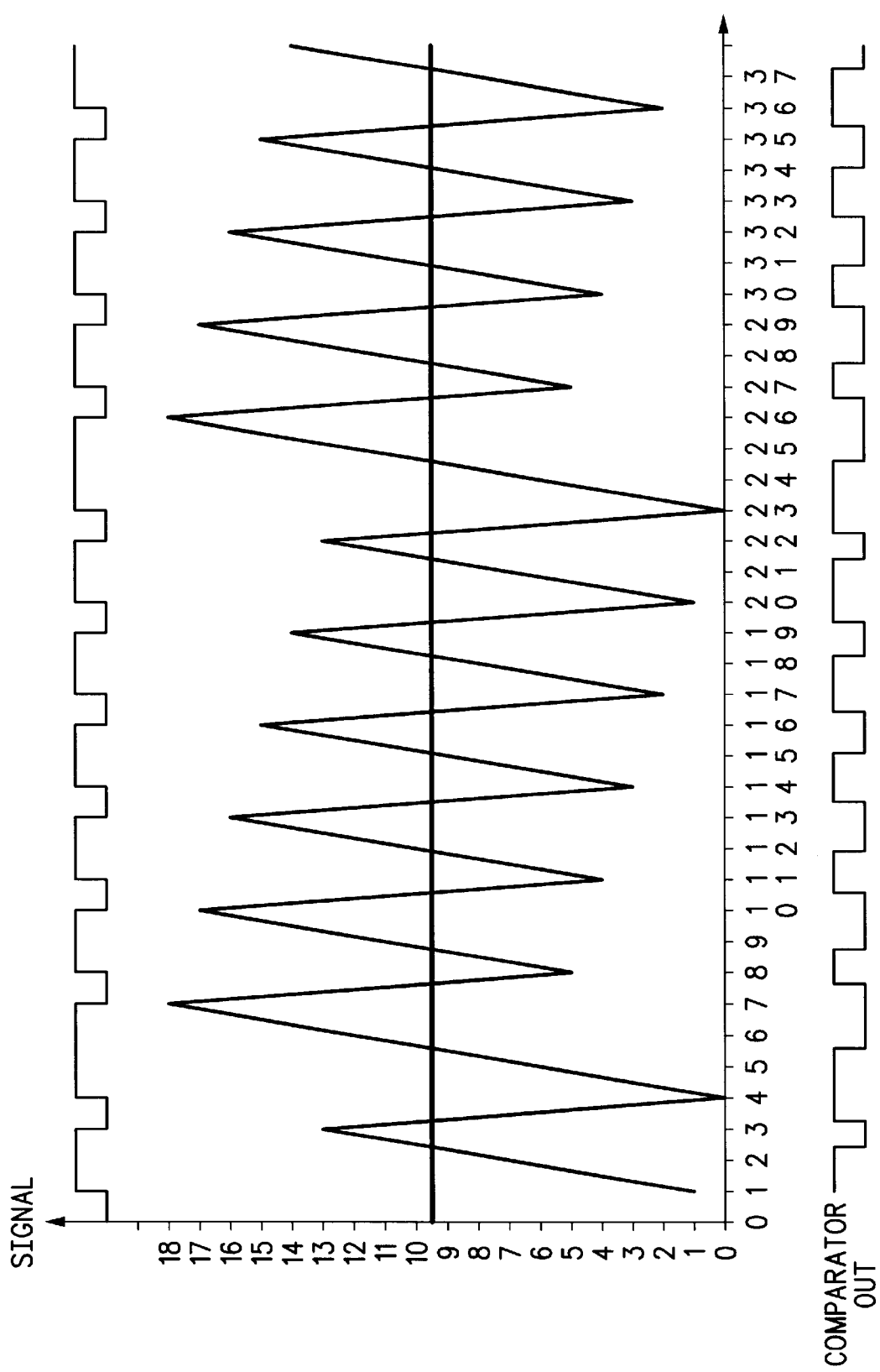
FIG. 2 illustrates an example diagram of the output of the clock generator 100 of FIG. 1 including capacitor voltage and corresponding register values.

FIG. 2 illustrates an example diagram of the output of the clock generator 100 of FIG. 1 including capacitor voltage and corresponding register values of register 108. Referring to FIG. 2, the output of digital comparator 106, the voltage on capacitor 122 and the output of analog comparator 126 are shown. For ease of illustration, the voltage on capacitor 122 is given in voltage units normalized to the range zero (0) through eighteen (18), which is also the numerical range of the content of multi-bit register 108. The voltage on capacitor 122 is shown as a linearly rising and falling voltage, centered, long term, around 9.5 voltage units. At the rising edge of each cycle of input clock signal CLOCK 101, the content of multi-bit register 108 has a numeric value indicated by the value of the sawtooth waveform at that instant in time, although the register value changes in a step-wise manner. Note that FIG. 2 illustrates an example where N=6 and M=19. These values are chosen for illustration purposes and should not be considered as limitation.

As illustrated in FIG. 2, the starting value in multi-bit register 108 is equal to one (1). At the first clock cycle, the starting value in multi-bit register 108 is incremented by summation circuit 110. The contents of multi-bit register 108, which has a starting value of one (1), and TUNING VALUE N 104, which has a value of six (6), are added to produce the SUM value which equals seven (7). Comparator 106 compares the SUM value seven (7) to the MODULUS VALUE M which is nineteen (19). Because seven is less than nineteen, comparator 106 produces a high logic value. The high logic value on the output of comparator 106 has two effects. One effect of the high logic value is that current sink 116 is turned off, and current source 118 is turned on, thereby maintaining a charging current on capacitor 122, and causing the voltage to rise linearly. When current source 118 is on, the voltage on capacitor 122 increases. The other effect of the high logic value results in select circuit 114 selecting the SUM value as the next input into multi-bit register 108. At the next rising edge of CLOCK 101, the contents of multi-bit register 108 change from one (1) to seven (7).

As the contents of multi-bit register 108 change from one (1) to seven (7), TUNING VALUE N 104 is added to the previous SUM value which changes from seven (7) to thirteen (13). Thirteen (13) is still less than nineteen (19), so that the output of comparator 106 stays high, allowing current source 118 to remain on, and select circuit 114 to keep the SUM value as the next input to multi-bit register 108. The voltage on capacitor 122 therefore keeps rising, and at the next rising edge of CLOCK 101, the contents of multi-bit register 108 becomes thirteen (13).

At the next rising edge of clock signal 101, TUNING VALUE N 104 is added to the SUM value which changes from thirteen (13) to nineteen (19). Since the SUM value is not less than MODULUS VALUE M 102, comparator 106 produces a low logic value as an output. The low logic value output has two effects. One effect of the low logic value output is that current sink 116 turns on and current source 118 turns off. When current sink 116 is on, the voltage on capacitor 122 decreases. The other effect of the low logic value output results in select circuit 104 selecting the SUM–M output of subtraction circuit 112 as the next input to multi-bit register 108. Thus, capacitor 122 discharges rapidly, and at the next rising edge of CLOCK 101, multi-bit register 108 will attain the value of zero (13+6–19=0). As the next value of multi-bit register 108 goes below the value of nineteen (19), comparator 106 again produces a high logic level as an output, and the initial states of current sink 116, current source 118, and select circuit 114 are restored. Capacitor 122 resumes charging, and the SUM value is selected as the next input to multi-bit register 108. The process continues in a similar manner as shown in FIG. 2.

Voltage comparator 126 compares the voltage on capacitor 122 to a reference or bias voltage 124. Based on the comparison, voltage comparator 126 produces either a low or high digital signal as shown in FIG. 2. Bias voltage 124 is set around the midpoint between the minimum and maximum voltages. In the example, bias voltage 124 is set at about 9.5 voltage units.

The distance between consecutive falling, or negative, edges of output 128 is a constant 3.167 or 3 & 1/6 cycles of input clock 101, which is equivalent to MODULUS VALUE M 102 divided by TUNING VALUE N 104 which equals 19/6 cycles. The phase jitter is theoretically zero. Rising, or positive, edges of output signal 128 have phase jitter, but a clock typically is used so that only one edge is of importance. Dividing by two in a subsequent flip-flop triggered on the negative edge of output 128 produces a 50% duty cycle with no phase jitter on either edge.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true scope of the invention.

What is claimed is:

1. A clock signal generation circuit for generating a digital clock signal comprising:
   a N/M digital divider circuit having an input for receiving an input clock signal, and an output for providing an output signal having a frequency which is equal to N/M times the input clock signal, where M and N are integers;
   a first current source;
   a second current source, wherein the first and second current sources are connected to the output of the N/M digital divider circuit and the output signal of the N/M digital divider circuit controls the operation of the first and second current sources;
   a capacitor having a first plate electrode coupled to ground and a second plate electrode coupled to the first and second current sources, wherein the first current source discharges the capacitor and the second current source charges the capacitor to produce a capacitor voltage at the second plate electrode; and
   a voltage comparator having a bias voltage as a first input and the capacitor voltage as a second input, wherein the voltage comparator compares the voltage on the capacitor to the bias voltage to produce the digital clock signal.

2. The clock signal generation circuit of claim 1, wherein the N/M digital divider circuit comprises a plurality of bits and the output signal of the N/M digital divider circuit is a one clock cycle long pulse which indicates when the most significant bit of the N/M digital divider circuit returns to a zero value.

3. The clock signal generation circuit of claim 1, wherein a voltage sensor and current controller is connected to the first current source, the second current source and the capacitor, wherein the voltage sensor and current controller monitors the capacitor voltage and adjusts the first and second current sources to control charging and discharging of the capacitor.

4. The clock generation circuit of claim 1, wherein the output signal of the N/M digital divider circuit operates the first and second current sources in a mutually exclusive manner.

5. The clock generation circuit of claim 1, wherein the voltage comparator is a fast voltage comparator.

6. The clock generation circuit of claim 1, wherein the capacitor voltage is characterized as being a relatively linear sawtooth waveform which has rising and falling rates that are proportional to the N and M−N values, respectively.

7. The clock signal generation circuit of claim 1, wherein the N value and M value are user selectable, wherein the M value is selected to be at least twice as large as the N value.

8. A clock signal generation circuit for generating a low jitter digital clock signal comprising:

a N/M digital divider circuit comprising:

a multi-bit register having an input for receiving an input clock signal, a plurality of inputs for receiving a multi-bit input value, and an output;

an adding circuit having a first input for receiving a tuning value N, a second input for receiving the output of the multi-bit register, and a multi-bit output, wherein the adding circuit adds the tuning value and the multi-bit input value to produce a sum value at the multi-bit output of the adding circuit;

a subtraction circuit having a first input for receiving a modulus value M, a second input for receiving the sum value, and a multi-bit output, wherein the subtraction circuit subtracts the modulus value M from the sum value to produce a subtraction value at the multi-bit output of the subtraction circuit;

a comparator having inputs for receiving the modulus value M and sum value, and an output for providing an output signal of the N/M digital divider circuit, wherein the comparator compares the sum value to the modulus value M and produces the output signal having a frequency which is equal to N/M times a frequency of the input clock signal; and a selection circuit having inputs for receiving the output of the comparator, the multi-bit output of the adding circuit, and the multi-bit output of the subtraction circuit, the selection circuit having a multi-bit output connected to the plurality of inputs of the multi-bit register, wherein the selection circuit selects a next multi-bit input value for input to the multi-bit register based on the output signal of the comparator;

a first current source;

a second current source, wherein the first and second current sources are connected to the output of the comparator and the output signal of the comparator controls the operation of the first and second current sources;

a capacitor having a first plate electrode coupled to ground and a second plate electrode coupled to the first and second current sources, wherein the first current source discharges the capacitor and the second current source charges the capacitor to produce a capacitor voltage at the second plate electrode; and a voltage comparator having a bias voltage as a first input and the capacitor voltage as a second input, wherein the voltage comparator compares the voltage on the capacitor to the bias voltage to produce the low jitter digital clock signal.

9. The clock signal generation circuit of claim 8, wherein the output signal of the N/M digital divider circuit is a one clock cycle long pulse which indicates when a most significant bit of the output signal of the N/M digital divider circuit returns to a zero value.

10. The clock signal generation circuit of claim 8, wherein a voltage sensor and current controller is coupled to the first current source, the second current source and the capacitor, wherein the voltage sensor and current controller monitors the capacitor voltage and adjusts the first and second current sources to control charging and discharging of the capacitor.

11. The clock generation circuit of claim 8, wherein the output signal of the N/M digital divider circuit operates the first and second current sources in a mutually exclusive manner.

12. The clock generation circuit of claim 8, wherein the voltage comparator is a fast voltage comparator.

13. The clock generation circuit of claim 8, wherein the capacitor voltage is characterized as being a relatively linear sawtooth waveform which has rising and falling rates that are proportional to the N and M−N values, respectively.

14. The clock signal generation circuit of claim 8, wherein a user selects the tuning value N and the modulus value M, wherein modulus value M is at least twice as large as the tuning value N.

* * * * *